United States Patent [19]
Kuo

[11] Patent Number: 6,153,457
[45] Date of Patent: Nov. 28, 2000

[54] METHOD OF FABRICATING SELF-ALIGN-CONTACT

[75] Inventor: Chien-Li Kuo, Hsinchu Hsien, Taiwan

[73] Assignee: United Microelectronics Corp., Hsinchu, Taiwan

[21] Appl. No.: 09/113,481

[22] Filed: Jul. 10, 1998

[30] Foreign Application Priority Data

Mar. 5, 1998 [TW] Taiwan ................................ 87103175

[51] Int. Cl.$^7$ .............................................. H01L 21/8238
[52] U.S. Cl. ........................ 438/233; 438/303; 438/586; 438/595
[58] Field of Search ................................ 438/233, 586, 438/595, 597, 637, 639, 303, 305

[56] References Cited

U.S. PATENT DOCUMENTS

| | | | |
|---|---|---|---|
| 5,466,636 | 11/1995 | Cronin et al. ............................ | 438/597 |
| 5,723,381 | 3/1998 | Grewal et al. ............................ | 438/633 |
| 5,759,867 | 6/1998 | Armacost et al. ........................ | 438/639 |
| 5,814,553 | 9/1998 | Chuang et al. ............................ | 438/595 |
| 5,897,372 | 4/1999 | Howard .................................... | 438/637 |
| 5,985,724 | 11/1999 | Kadosh et al. ............................ | 438/305 |
| 5,990,524 | 11/1999 | En et al. .................................. | 257/382 |
| 6,017,823 | 1/2000 | Shishiguchi et al. .................... | 438/595 |
| 6,043,116 | 3/2000 | Kuo .......................................... | 438/233 |
| 6,083,828 | 7/2000 | Lin et al. ................................. | 438/639 |

*Primary Examiner*—John F. Niebling
*Assistant Examiner*—Lynne Gurley
*Attorney, Agent, or Firm*—Thomas, Kayden, Horstemeyer & Risley

[57] ABSTRACT

A method of fabricating a self-align-contact is provided. First, a semiconductor substrate is provided on which there are two gates, a source/drain region between the two gates and a first spacer on the sidewalls of each gate. The first spacer is removed. A first dielectric layer and a second dielectric layer are formed on the semiconductor substrate. The first dielectric layer is 200–300 Å thick. The second dielectric layer is patterned. The first dielectric layer is anisotropically etched by using the second dielectric layer as a mask to form a self-align-contact opening between the two gates to expose the source/drain region, and to form a second spacer on the sidewalls of the gate. The width of the second spacer is smaller than the width of the first spacer. Therefore, the exposed area of the source/drain region connected the self-align-contact increases.

20 Claims, 4 Drawing Sheets

METHOD OF FABRICATING SELF-ALIGN-CONTACT

CROSS-REFERENCE TO RELATED APPLICATION

This application claims the priority benefit of Taiwan application serial no. 87103175, filed Mar. 5, 1998, the full disclosure of which is incorporated herein by reference.

BACKGROUND OF THE INVENTION

1. Field of the Invention

The invention relates in general to the method of fabricating a semiconductor device, and more particularly to the method of fabricating a self-align-contact with low resistance.

2. Description of the Related Art

In the semiconductor process there are many methods of fabricating a self-align-contact. One of conventional methods of forming a self-align-contact includes first providing a substrate on which there are at least two MOS devices and then forming an insulating layer, such as silicon oxide, on the substrate. Each of the two MOS devices includes a polysilicon gate and spacers on the sidewalls of the gate. The two MOS devices have a common source/drain region located between the gates of the two MOS devices. The insulating layer is patterned to form a self-align-contact opening to expose the common source/drain region. A conductive layer is deposited in the self-align-contact opening to form a self-align-contact of prior art.

A process flow showing the formation of a conventional self-align-contact is illustrated by FIGS. 1A–1D. Referring to FIG. 1A, a gate 102 and source/drain regions 110 are formed on a semiconductor substrate 100. The gate 102 includes a gate oxide 104, a doped polysilicon layer 106 and a cap layer 108. The cap layer 108 is formed over the doped polysilicon layer 106 to protect the doped polysilicon layer 106. A spacer 112 is formed on the sidewalls of the gate 102. The source/drain regions 110 are lightly doped drain (LDD) structures. The method of forming the source/drain regions 110 includes lightly implanting ions into the semiconductor substrate 100 using the gate 102 as a mask and heavily implanting ions into the semiconductor substrate 100 using the spacer 112 as a mask. Referring to FIG. 1B, a dielectric layer 114 is formed on the semiconductor substrate 100 by CVD.

Next, referring to FIG. 1C, the dielectric layer 114 is patterned by both a lithography process and by etching to form a contact opening 116 between two gates 102 to expose the source/drain region 110. When etching the dielectric layer 114, the spacer 114a is naturally formed on the spacer 112. Therefore, the spacer structure on the sidewalls of the gate 102 has a large width, including the width of the spacer 114a and the width of the spacer 112.

Next, referring to FIG. 1D, a conductive layer 118, such as doped polysilicon, is deposited in the contact opening 116 and on the semiconductor substrate 100. The conductive layer 118 is patterned to form a self-align-contact of prior art.

In the integrated circuits (IC) process, the conventional method of fabricating a self-align-contact includes many drawbacks. For example, the width of the self-align-contact is very large. As shown in FIG. 1C, the spacer 114a reduces the exposed surface of the source/drain regions 110 from the length X to the length Y. The reduction of the exposed area of the source/drain regions 110 increases the resistance of the self-align-contact and cannot meet the needs of current integrated circuits with high operation speed.

SUMMARY OF THE INVENTION

It is an object of the invention to provide a method of fabricating a self-align-contact that includes a spacer with a narrow width to increase the bottom area of the self-align-contact.

It is another object of the invention to provide a simple method of fabricating a self-align-contact with low resistance and the ability to make good ohmic contact between the self-align-contact and the source/drain regions.

It is yet another object of the invention to provide a method of fabricating a self-align-contact to match the needs of current integrated circuits with high operation speed.

A method of fabricating a self-align-contact is provided. First, a semiconductor substrate is provided on which there are two gates, a source/drain region between the two gates and a first spacer on the sidewalls of each gate. The first spacer is removed. A first dielectric layer and a second dielectric layer are formed on the semiconductor substrate. The first dielectric layer is 200–300 Å thick. The second dielectric layer is patterned using the first dielectric layer as a stop layer. The first dielectric layer is anisotropically etched by using the second dielectric layer as a mask to form a self-align-contact opening between the two gates to expose the source/drain region, and to form a second spacer on the sidewalls of the gate. The width of the second spacer is smaller than the width of the first spacer. Therefore, the exposed area of the source/drain region connecting the self-align-contact increases.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The method of the invention is to form a self-align-contact with low resistance and the ability to make good ohmic contact by using a salicide process.

Figure 1A:
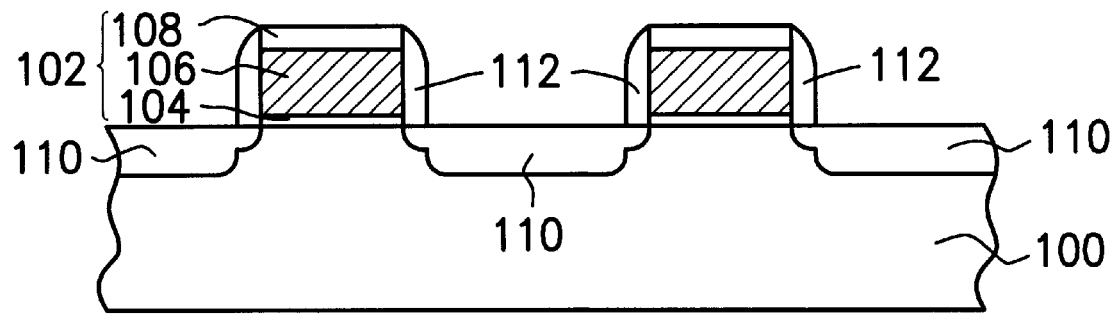
FIGS. 1A to 1D are cross-sectional views showing a conventional process flow of fabricating a self-align-contact.
Figure 1B:
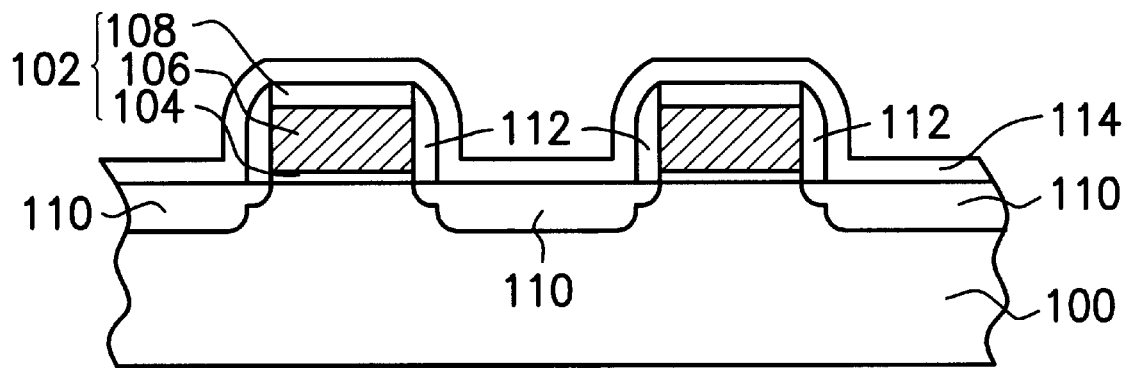
Figure 1C:
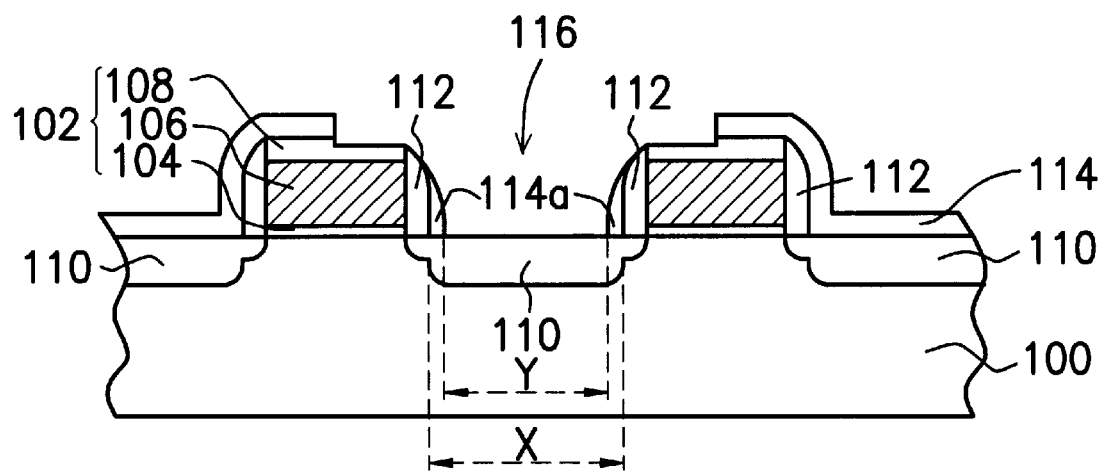
Figure 1D:
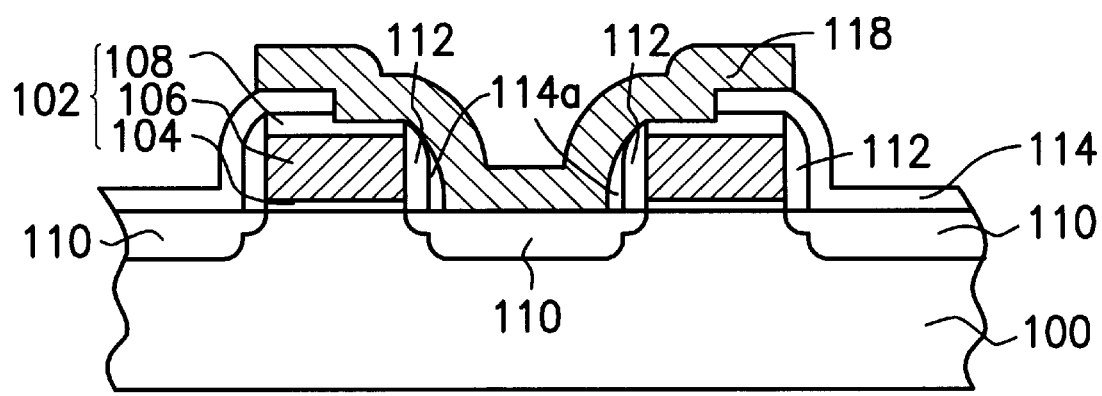
Figure 2A:
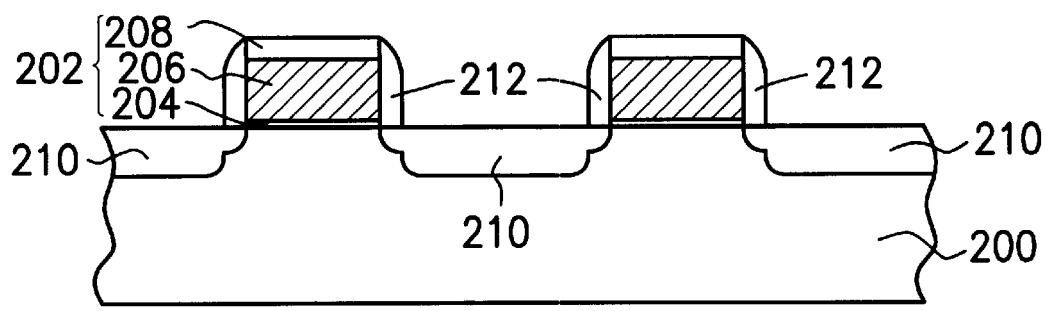
FIGS. 2A to 2F are cross-sectional views showing a process flow of fabricating a self-align-contact of the invention.

FIGS. 2A to 2E are cross-sectional views showing a process flow of fabricating a self-align-contact of the invention. Referring to FIG. 2A, a gate 202 and source/drain regions 210 are formed on a semiconductor substrate 200. The semiconductor substrate 200 is a lightly doped P-type semiconductor substrate or a lightly doped P-type well. The gate 202 includes a gate oxide 204, a conductive doped polysilicon layer 206 and a cap layer 208. The method of forming the gate oxide 204 includes oxidizing the semiconductor substrate 200 at a temperature of 800–1000° C. The gate oxide 204 is oxide and is 30–200 Å thick. The conductive layer 206 includes a doped polysilicon layer and a metal silicide layer. The doped polysilicon layer is formed to a thickness of 1000–3000 Å by low-pressure chemical vapor deposition (LPCVD). The doped polysilicon layer is formed by depositing a polysilicon layer, implanting phosphorus or arsenic ions into the polysilicon layer and annealing the polysilicon layer. The implanting step is performed either with or after the depositing step. The metal silicide layer includes $WSi_2$, $TiSi_2$, and $MoSi_2$. The metal silicide layer is 1000–3000 Å thick. The cap layer 208 is formed on the conductive layer 206 to protect the conductive layer 206. The cap layer 208 includes silicon oxide or silicon nitride by chemical vapor deposition (CVD). The cap layer 208 is 1500–2000 Å thick. A sacrificial spacer 212 is formed on the sidewalls of the gate 202. The sacrificial spacer 212 is formed by depositing an insulating layer with a thickness of 1500–2000 Å on the semiconductor substrate 200 and by etching back the insulating layer.

The source/drain regions 210 are lightly doped drain (LDD) structures. The method of forming the source/drain regions 210 includes lightly implanting ions, such as phosphorus or arsenic ions, into the semiconductor substrate 200 using the gate 202 as a mask and heavily implanting ions into the semiconductor substrate 200 using the sacrificial spacer 212 as a mask. The preferred energy of the light implantation is 40–80 KeV and the preferred dosage of the light implantation is $5\times10^{12}$–$5\times10^{14}$ ions/cm$^2$. The preferred energy of the heavy implantation is 50–80 KeV and the preferred dosage of the heavy implantation is $1\times10^{15}$–$8\times10^{15}$ ions/cm$^2$.

Figure 2B:
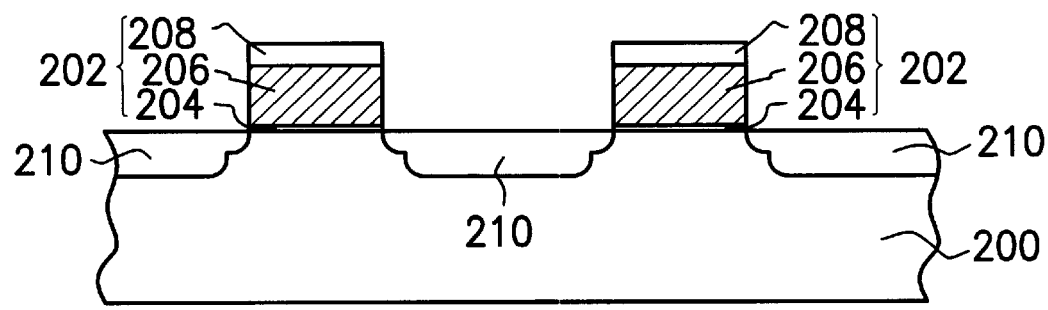
Figure 2C:
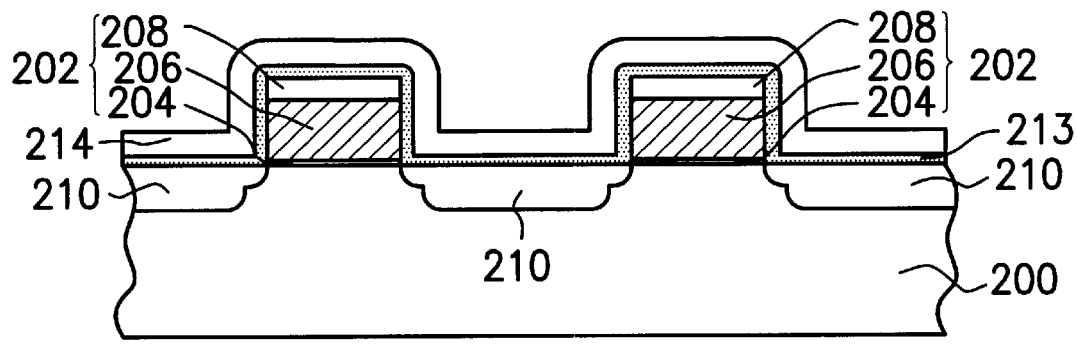

Referring to FIG. 2B, the sacrificial spacer 212 is removed by isotropic etching. Referring to FIG. 2C, a dielectric layer 213 is formed on the gate 202, the source/drain regions 210 and the sacrificial spacer 212 by chemical vapor deposition (CVD). A dielectric layer 214 is formed on the dielectric layer 213 by chemical vapor deposition (CVD). The etching rate of the dielectric layer 213 and the etching rate of the dielectric layer 214 are different. In addition, the etching rate of the dielectric layer 213 and the etching rate of the cap layer 208 are also different. For example, the dielectric layer 213 can be silicon oxide while the dielectric layer 214 is silicon nitride or the dielectric layer 213 can be silicon nitride while the dielectric layer 214 is silicon oxide. In addition, the thickness of the dielectric layer 213 is less than thickness of the dielectric layer 214. The dielectric layer 213 is preferably 200–300 Å thick.

Figure 2D:
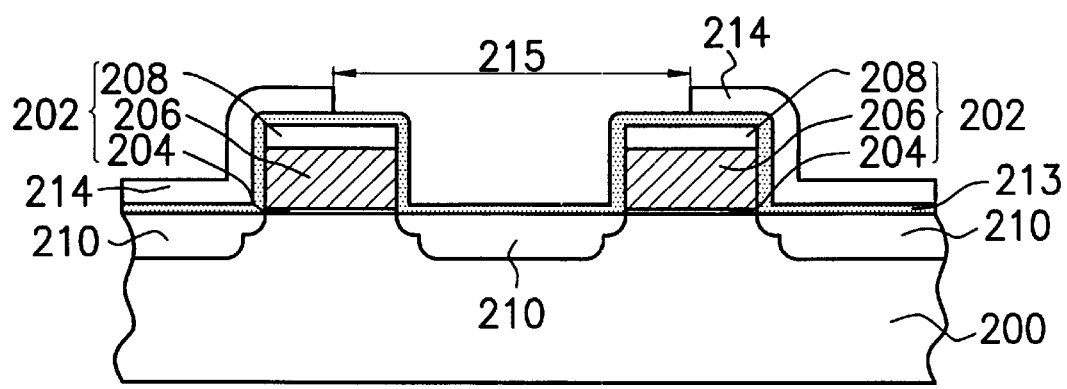

Referring to FIG. 2D, the dielectric layer 214 is patterned by lithography and an anisotropic etching process to form an opening 215 to expose the dielectric layer 213. The dielectric layer 213 can be an etching stop layer because of the different etching selectivity of the dielectric layer 213 and the dielectric layer 214.

Figure 2E:
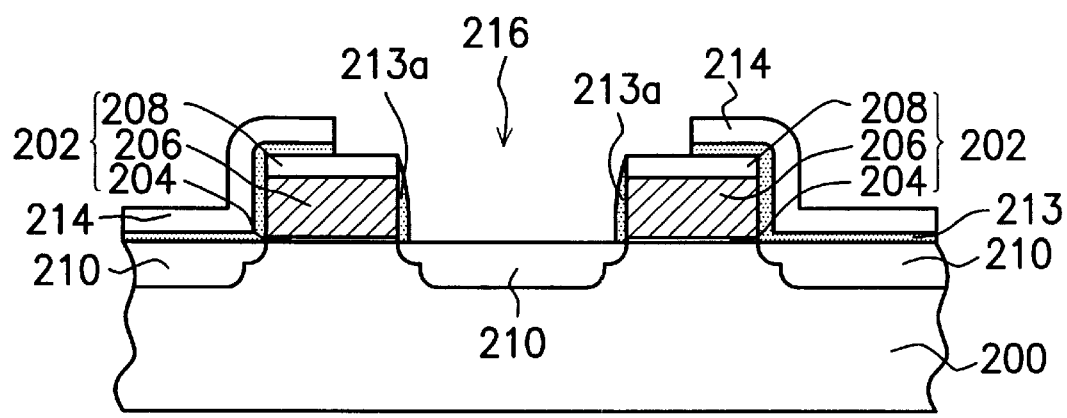

Referring next to FIG. 2E, a self-contact opening 216 is formed by anisotropically etching the dielectric layer 213 using the dielectric layer 214 as a mask to expose the source/drain regions 210. After etching, a spacer 213a is naturally formed on the sidewalls of the gate 202. Because the thickness of the dielectric layer 213 is very small, the width of the spacer 213a is very narrow, too. The width of the spacer 213a is narrower than that of prior art. Therefore, the exposed area of the source/drain regions 210 increases.

Figure 2F:
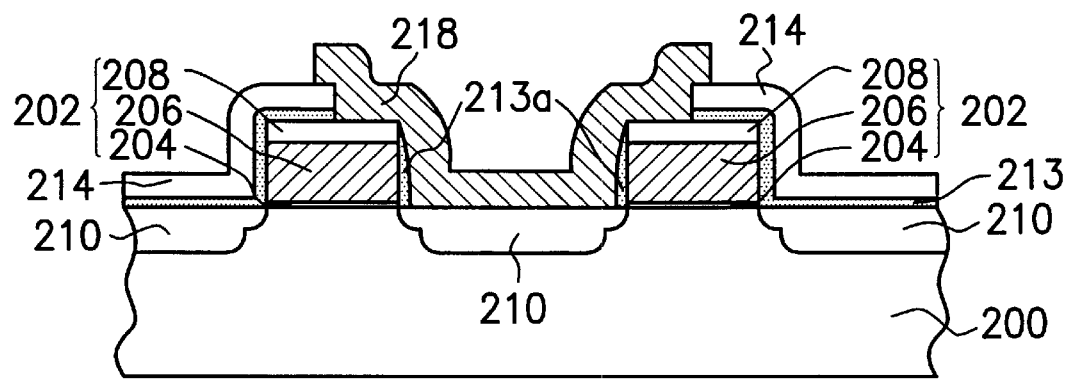

Referring next to FIG. 2F, a conductive layer 218 is deposited on the gate 202, the spacer 213a and the source/drain regions 210. The conductive layer 218 includes a doped polysilicon layer or both a doped polysilicon layer and a metal silicide layer, such as $WSi_2$, $TiSi_2$, and $MoSi_2$. The method of forming the doped polysilicon layer is low-pressure chemical vapor deposition (LPCVD). The conductive layer 218 is formed to a thickness of 1000–3000 Å. The conductive layer 218 is formed by depositing a polysilicon layer, implanting phosphorus or arsenic ions into the polysilicon layer and annealing the polysilicon layer. The implanting step is performed either with or after the depositing step. Finally, the conductive layer 218 is patterned by lithography and an etching process. A self-align-contact of the invention is accomplished.

The self-align-contact of the invention has the following characteristics:

1. The self-align-contact of the invention includes the spacer 213a with a narrow width to increase the ohmic contact between the self-align-contact and the source/drain regions 210 and to reduce the resistance of the self-align-contact.

2. The self-align-contact of the invention includes the spacer 213a with a narrow width to increase the exposed area of the source/drain regions 210 and to increase the integration of semiconductor devices.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A method of fabricating a self-align-contact, wherein a gate and a first spacer are set on a semiconductor substrate and a source/drain region is formed in the semiconductor substrate, said method comprising the steps of:

removing the first spacer;

forming a first dielectric layer and a second dielectric layer on the semiconductor substrate, wherein the first dielectric layer is formed under the second dielectric layer, and the thickness of the first dielectric layer is smaller than the thickness of the second dielectric layer;

forming an opening in the second dielectric layer corresponding to the source/drain region using the first dielectric layer as a stop layer;

removing part of the first dielectric layer by using the second dielectric layer as a mask to form a contact opening to expose the source/drain region, and to form a second spacer on the sidewalls of the gate; and forming a conductive layer on the source/drain region and in the contact opening.

2. A method as claimed in claim 1, wherein the source/drain region is a lightly doped drain (LDD) structure.

3. A method as claimed in claim 1, wherein the width of the second spacer is smaller than the width of the first spacer.

4. A method as claimed in claim 1, wherein the method of forming the first spacer includes depositing an insulating layer with a thickness of 1500–2000 Å on the semiconductor substrate and by etching back the insulating layer.

5. A method as claimed in claim 1, wherein the etching rate of the first dielectric layer and the etching rate of the second dielectric layer are different.

6. A method as claimed in claim 1, wherein the first dielectric layer is silicon oxide and the second dielectric layer is silicon nitride.

7. A method as claimed in claim 1, wherein the first dielectric layer is silicon nitride and the second dielectric layer is silicon oxide.

8. A method as claimed in claim 1, wherein the method of forming the first dielectric layer includes chemical vapor deposition (CVD).

9. A method as claimed in claim 1, wherein the first dielectric layer is 200–300 Å thick.

10. A method as claimed in claim 1, wherein the method of removing part of the first dielectric layer includes anisotropic etching.

11. A method as claimed in claim 1, wherein the conductive layer includes doped polysilicon.

12. A method as claimed in claim 1, wherein the conductive layer includes a doped polysilicon layer and a metal silicide layer.

13. A method of fabricating a self-align-contact, wherein two gates and a first spacer on the sidewalls of each gate are set on a semiconductor substrate and a source/drain region is formed in the area of the semiconductor substrate between the gates, said method comprising the steps of removing the first spacer;

forming a first dielectric layer and a second dielectric layer on the semiconductor substrate, wherein the first dielectric layer is formed under the second dielectric layer, and the thickness of the first dielectric layer is smaller than the thickness of the second dielectric layer;

forming an opening in the second dielectric layer corresponding to the source/drain region using the first dielectric layer as a stop layer;

removing part of the first dielectric layer by using the second dielectric layer as a mask to form a self-align-contact opening between the two gates to expose the source/drain region and to form a second spacer on the sidewalls of the gate; and forming a conductive layer on the source/drain region and in the self-align-contact opening.

14. A method as claimed in claim 13, wherein the width of the second spacer is smaller than the width of the first spacer.

15. A method as claimed in claim 13, wherein the method of forming the first spacer includes depositing an insulating layer with a thickness of 1500–2000 Å on the semiconductor substrate and by etching back the insulating layer.

16. A method as claimed in claim 13, wherein etching rate of the first dielectric layer and the etching rate of the second dielectric layer are different.

17. A method as claimed in claim 13, wherein the first dielectric layer is silicon oxide and the second dielectric layer is silicon nitride.

18. A method as claimed in claim 13, wherein the first dielectric layer is silicon nitride and the second dielectric layer is silicon oxide.

19. A method as claimed in claim 13, wherein the first dielectric layer is 200–300 Å thick.

20. A method as claimed in claim 13, wherein the method of removing part of the first dielectric layer includes anisotropic etching.

* * * * *